United States Patent [19]

Chu et al.

[11] 4,093,971
[45] June 6, 1978

[54] D-I-P ON ISLAND

[75] Inventors: Bing-Lun Chu; Wunnava Venkata Subbarao, both of Piscataway, N.J.; Jack Peale, Scarsdale, N.Y.; Kent McCune, Belle Mead; Marvin Elroy Steiner, East Brunswick, both of N.J.

[73] Assignee: Burroughs Corporation, Detroit, Mich.

[21] Appl. No.: 748,837

[22] Filed: Dec. 10, 1976

[51] Int. Cl.² ............................................. H05K 7/20
[52] U.S. Cl. .................................... 361/382; 361/385; 357/81
[58] Field of Search ............... 174/16 HS; 357/81, 82; 361/385, 386, 388, 382

[56] References Cited

U.S. PATENT DOCUMENTS

| 3,946,276 | 3/1976 | Braun | 361/385 |
|---|---|---|---|
| 4,037,270 | 7/1977 | Ahmann | 361/385 |

*Primary Examiner*—Gerald P. Tolin

*Attorney, Agent, or Firm*—Joseph R. Dwyer; Mervyn L. Young; Kevin R. Peterson

[57] ABSTRACT

A cooling system for integrated circuit packaging of the conventional dual-in-line (DIP) type, including a cold bar which engages the DIPs and is thermally and mechanically connected at both ends to a cooling frame in which a serpentine tubing carries coolant throughout spaced-apart sections thereof. Clamping means clamp the DIPs tight against the cold bar so that heat generated by the DIPs is carried away through the cold bar into the frame sections where the coolant circulates. The cold bar is disposed so that discrete components may be disposed on the island in a manner to save lateral space, and a multiplicity of these DIPs, cold bars, etc. are mounted on the cooling frame to form a DIP island cooling frame and may include, for example, driver buffer logic, random access memories, as well as I/O logic. Each DIP island can be connected to a cooling frame having other types of integrated circuits and housed in the same console or housed along with similar DIP islands in a similar console, as desired.

6 Claims, 6 Drawing Figures

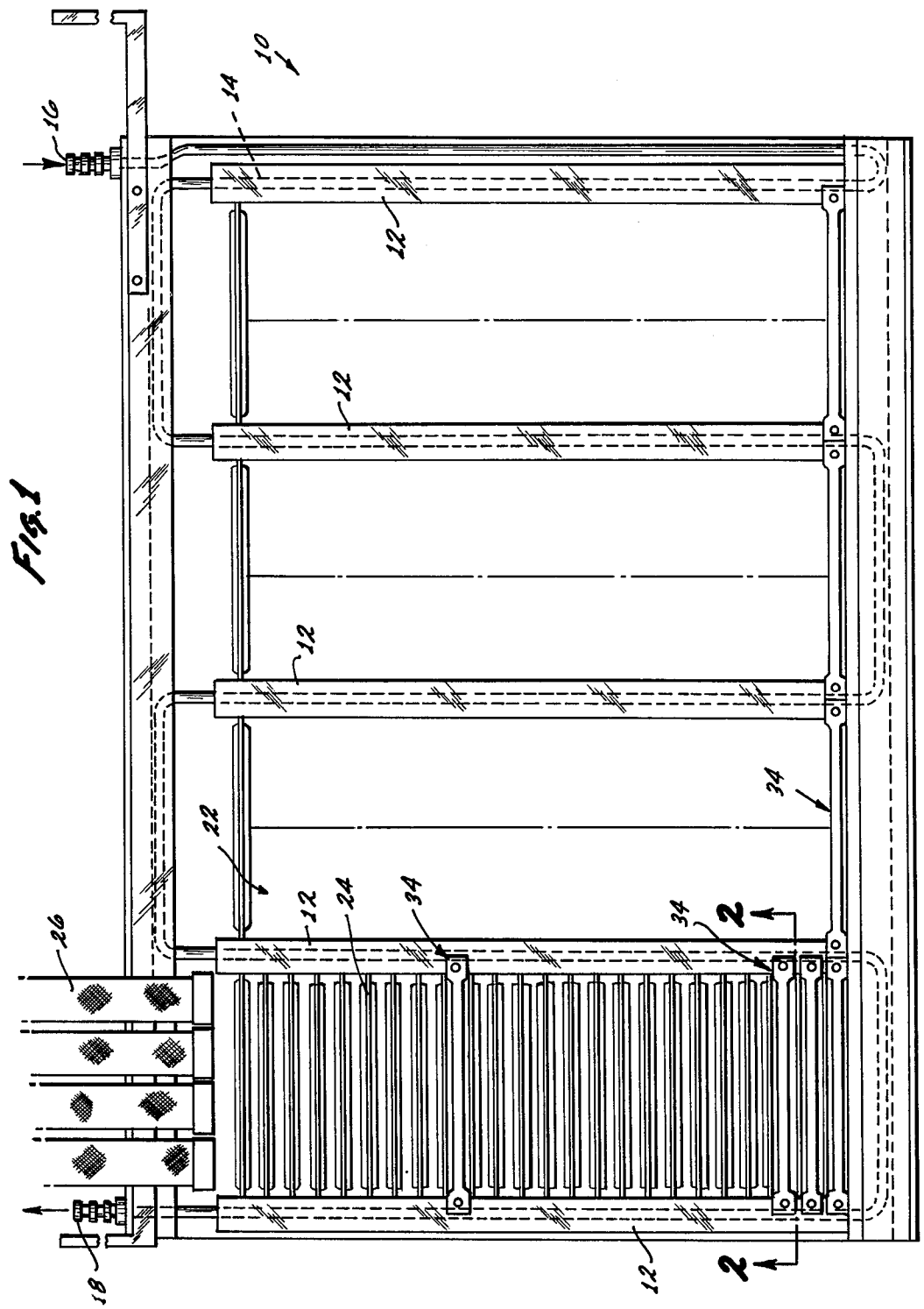

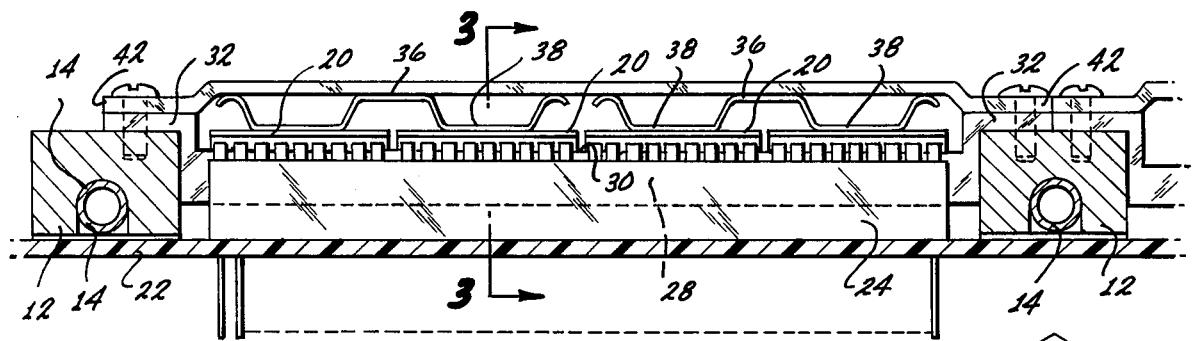
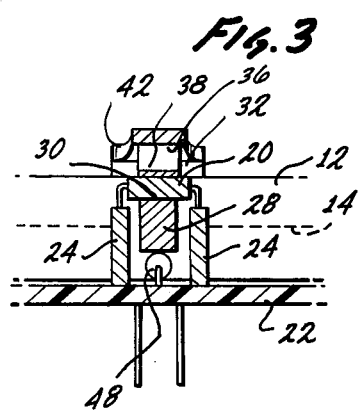
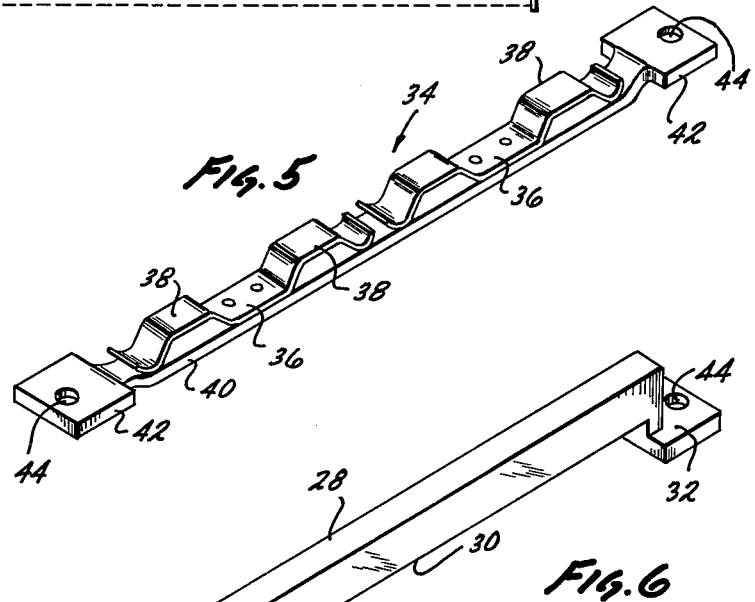
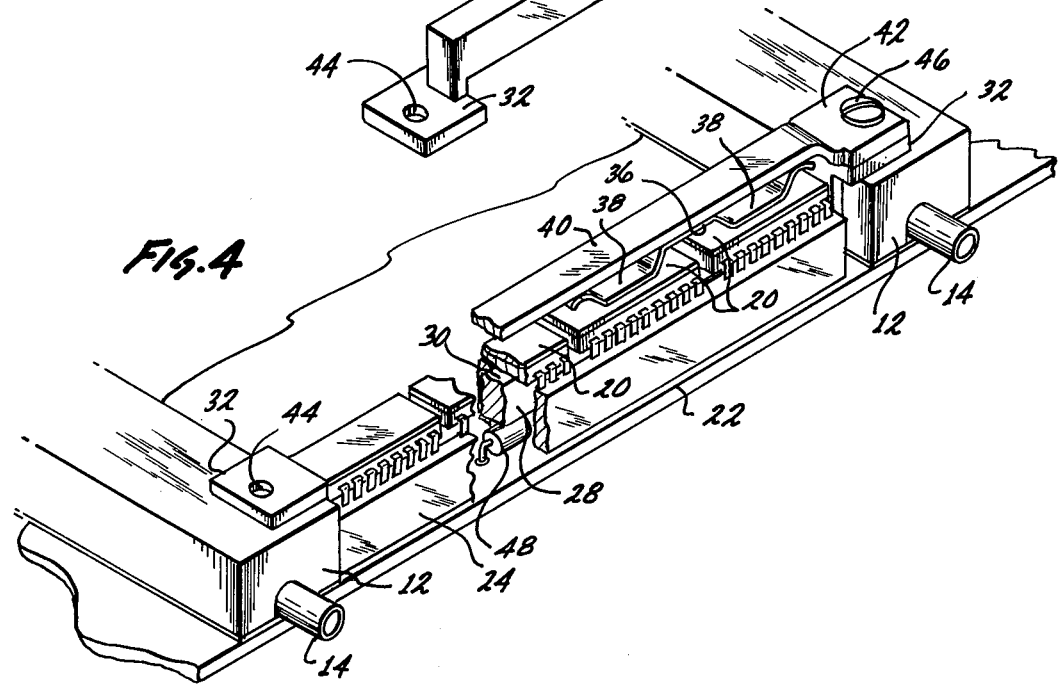

D-I-P ON ISLAND

CROSS REFERENCE TO RELATED APPLICATION

To the extent that the present invention involves integrated circuits, which may be packaged in the manner described and claimed in Application Ser. No. 4,656,784, now a continuation U.S. application Ser. No. 666,099 entitled, "Leadless Ceramic Package for Integrated Circuit Having Heat Sink Means" by Robert S. Morse, such continuation Application is referenced herein. This co-pending continuation Application is assigned to the same assignee as the present application.

BACKGROUND OF THE INVENTION

In the U.S. Pat. No. 3,946,276 to Braun et al, entitled "Island Assembly Employing Cooling Means for High Density Integrated Circuit Packaging" dated Mar. 23, 1976, it was shown that to maximize the operation of high density integrated circuits for high speed computer systems, an efficient cooling means was required to secure thermal impedance control. The packaging system disclosed and claimed therein was oriented toward high quality production and assembly to achieve minimum costs and, as shown, included at least one island which comprised an assembly of a plurality of integrated circuit packages of the leadless type, connectors for receiving the packages, an inter-package connection medium and a cooling frame. The island cooling frame supported the assembly and further incorporated a continuous tubing arranged in a serpentine path through which a liquid coolant was pumped to carry away the heat generated by the integrated circuit packages. This heat transfer was accomplished efficiently by permitting metal heat sink plates formed as an integral part of the integrated circuit packages to contact the cooling frame sections so that the circulating coolant maintained the island at a substantially uniform temperature. The patent also taught the manner in which a plurality of such islands may be interconnected through the use of ribbon-type interconnect cables having terminal boards at each end which were adapted to plug into similar connectors and that several islands could be housed in a console.

To improve, however, the operation and adaptability of the island assembly to which the aforesaid patented invention pertains, it has been found desirable to provide for interconnection of the patented system to other systems and to other devices, such as I/O terminals, manufactured by the assignee of this invention or by others, to combine the patented system with other types of integrated circuit packages manufactured by this assignee and by others and to mount them in a cooling frame of the same overall dimension so as to be housed in the same or similar sized console, and to subject these packages to the same or similar circulating coolant. It, of course, was found to be desirable to do all this with a minimum of modification so as to lessen the cost and yet maintain the high quality production and assembly processes to which the patented invention was oriented.

SUMMARY OF THE INVENTION

In accordance with the invention which fulfills the foregoing desires, there is provided a cooling system for integrated circuit packaging of the conventional dual-in-line (DIP) type whose pins are inserted into linear sockets mounted on an interconnection medium. Spanning the bodies of the DIPs is a cold bar which is thermally and mechanically connected at both ends to a cooling frame in which a serpentine tubing carries coolant throughout spaced-apart sections thereof. Clamping means are also provided for clamping the DIPs tight against the cold bar so that heat generated by the DIPs is carried away through the cold bar into the frame sections where the coolant circulates. The cold bar is spaced from the interconnection medium sufficient distance to allow discrete components to be mounted on the medium but between the medium and the cold bar to save lateral space. A multiplicity of these DIPs, cold bars, etc. are mounted on the cooling frame to form a DIP island cooling frame, including, for example, driver buffer logic, random access memories, as well as I/O logic. Each DIP island can be connected to a cooling frame having integrated circuits of other types and housed in the same console or housed along with similar DIP islands in a similar console, as desired.

BRIEF DESCRIPTION OF THE DRAWINGS

FIG. 1 is a plan view of an island illustrating the packaging system for the DIPs;

FIG. 2 is a cross-sectional view of a portion of the island taken along line 2—2 of FIG. 1 and looking in the direction of the arrows;

FIG. 3 is a cross-sectional view of one of the clamping means taken along line 3—3 of FIG. 2 and looking in the direction of the arrows;

FIG. 4 is a view of a portion of an island similar to FIG. 2 but in perspective and partially broken away to show the relationship of the parts more clearly;

FIG. 5 is a view of the clamping bar but shown upside-down relative to the showings of FIGS. 1–4 to illustrate the ribbon-type springs for clamping the DIPs to the cold bar; and FIG. 6 is a perspective view of the cold bar but again, like FIG. 5, is shown upside-down to more clearly illustrate the cold bar.

DESCRIPTION OF THE PREFERRED EMBODIMENT

Referring first to FIG. 1, there is shown an island assembly cooling frame 10, having a plurality of spaced-apart parallel sections 12 (five shown) having continuous tubing 14 disposed therein in a serpentine fashion for the flow of coolant therethrough. A refrigeration-type evaporator system is connected to the inlet 16 and outlet 18 of the tubing and includes a pump, a heat exchanger and means to blow air through the exchanger to reduce the temperature of the coolant returning from the frame 10. Since any cooling system that will accomplish the heat transfer is satisfactory and well-known, no further description is deemed necessary herein.

The purpose of the cooling frame 10 and the circulating coolant is to maintain integrated circuit packages 20 more clearly shown in FIGS. 2 and 4 as dual-in-line type (DIP) when mounted in the frame as shown in FIG. 1 at a uniform temperature during operation.

In the embodiment shown, the DIPs 20 are mounted in rows 12 shown schematically only in FIG. 1 between two adjacent frame sections. These DIPs are electrically connected to an interconnection medium 22 or printed circuit board through a plurality of connectors 24 having leads which connect with printed wiring conductors on the medium for electrically interfacing with other DIPs as well as with other islands. The printed circuit board and island are, in turn, connected to other islands by suitable interconnect cable assemblies 26 (four only shown in FIG. 1) and this arrangement permits input and/or output signal information to be transferred from the island or other islands and to electrical devices which may be included in or external to the system. As shown in FIG. 1, four such DIPs can be placed laterally between the frame sections 12 in pairs of connectors 24 and a plurality of such rows of DIPs can be placed in the frame as shown as an example in this Figure.

Turning now to FIGS. 2 and 3, taken together, it can be seen that an elongated metallic cold bar 28 generally rectangular in cross-section, having a flat top surface 30 is of a length to substantially span the distance between the frame sections 12. This cold bar 28 is provided with relatively thin integral flanges 32 on the ends thereof and offset the main center line of the cold bar itself and somewhat larger in width to seat on the top of the frame sections 12 for the maximum transfer of heat therebetween.

In order to insure that the DIPs are in tight, thermal contact with the top 30 of the cold bar, a DIP clamp 34 is provided. This clamp has the plurality of relatively thin, resilient springs 36 formed of an elongated piece of spring material with lands 38 (one from each DIP) which springs are fastened to the underside of an elongated clamp bar 40. The clamp bar is generally of the same length and width as the cold bar 28 and also provided with apertures 44 through which suitable fastening means, such as screws 46, may be received to threadably engage the DIP clamp and the cold bar and force the two tight against the frame.

More particularly with reference to FIGS. 2, 3 and 6, it can be seen that the flanges 32 of the cold bar, while integral therewith, are spaced a distance from the top surface of the cold bar so that the bar itself when assembled as shown in FIGS. 2 and 3 is approximately midway the distance between the top of the interconnect medium 22 and the top of the frame sections 12 to allow, first, for the spring lands 38 of the DIP clamp to accommodate the thickness of the DIPs resting on the top of the cold bar, and, secondly at the same time, to accomodate a plurality of discrete electrical components mounted on the interconnect medium 22 to save lateral space on the island. To illustrate this aspect of the invention, a resistor 48 is shown in the broken-away portion of FIGS. 3 and 4.

Thus, assembly of the island is relatively simple and, in the event of repair or replacement of any of the DIPs is required, the removal of any DIP is accomplished by simply removing the clamping means for that purpose.

Finally, as aforesaid, this island and similar islands can be housed in a console along with similar islands or along with islands containing the integrated circuit packages of the leadless type described and claimed in the aforesaid Braun et al patent and may be connected to the same coolant circulating system or to a separate cooling system, as desired.

What is claimed is:

1. A packaging system for electronic equipment comprising at least one island, including:

a plurality of integrated circuit packages of the dual-in-line type, connector means mounting said packages, an interconnection medium having electrical conductors thereon, each of the connector means having a plurality of electrical contacts and operatively connected in a predetermined relationship to said interconnection medium and providing respective electrical paths between said integrated circuit packages and said interconnection medium conductors, a cooling frame fastened to said interconnection medium configured such that a plurality of sections of thermally conductive material are situated in parallel, spaced apart relationship across the surface of said interconnection medium and containing fluid conduit means for carrying cooling fluid therethrough, each of said connector means and packages being located in the space between an adjacent pair of said cooling frame sections, but out of engagement with said frame sections, a cold bar disposed transversely of said frame sections and below the top of said frame sections with means on said bar attached to the top of said frame sections so that said means engages said frame sections in thermal conductive relationship, and clamping means urging said packages into thermal contact with said cold bar whereby heat generated by said packages is transferred to said cold bar and to the ends of said bar for transfer to said frame sections.

2. A packaging system as defined in claim 1 wherein said cold bar is provided with a pair of flanges one on each end thereof which are attached to the frame sections and space the cold bar a sufficient distance from the top of the frame sections to permit said integrated circuit packages to straddle said cold bar.

3. The packaging system as defined in claim 2 wherein said clamping means comprises a metallic bar of a length substantially equal to the length of said cold bar and having spring means thereon for urging said integrated circuit packages into engagement with said cold bar.

4. The packaging system as defined in claim 3 wherein said bar of said clamping means further has flanges on each end adapted to overlay coextensively with the flanges of said cold bar, and fastening means engaging the flanges of said cold bar and the bar of said clamping means and further engaging said spaced apart frame sections for fastening said bars to said frame sections.

5. The packaging system as defined in claim 4 wherein said conduit means comprises continuous tubing connecting said frame sections and arranged in a serpentine path for maintaining said integrated circuit packages at a substantially uniform temperature.

6. The packaging system as defined in claim 5 wherein said cold bar is spaced from said interconnection medium so as to allow discrete components to be mounted on said interconnection medium between said medium and said cold bar to save lateral space within said frame.

* * * * *